(12) United States Patent
Chou

(10) Patent No.: US 7,175,329 B1
(45) Date of Patent: Feb. 13, 2007

(54) BOTTOM LIGHTING MODULE

(75) Inventor: Shen-Hong Chou, Miao Li Hsien (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 11/267,511

(22) Filed: Nov. 7, 2005

(30) Foreign Application Priority Data

Aug. 17, 2005 (TW) .............................. 94128093 A

(51) Int. Cl.
*F21V 7/04* (2006.01)
(52) U.S. Cl. ...................................... 362/612; 362/631
(58) Field of Classification Search ................ 362/612
See application file for complete search history.

(56) References Cited

U.S. PATENT DOCUMENTS 6,789,921 B1 * 9/2004 Deloy et al. ................ 362/252

2003/0035917 A1 * 2/2003 Hyman ......................... 428/67
2004/0037077 A1 * 2/2004 Showers et al. ............ 362/249
2006/0023448 A1 * 2/2006 Mok et al. .................. 362/231

FOREIGN PATENT DOCUMENTS

JP 02150080 A * 6/1990

* cited by examiner

*Primary Examiner*—Ali Alavi
(74) *Attorney, Agent, or Firm*—Troxell Law Office, PLLC

(57) ABSTRACT

A bottom lighting module comprises a PCB, a reflection sheet and plurality of light-emitting diodes (LEDs). The PCB has a first face, a second face opposing to the first face and a opening connecting spatially the first face and the second face. The reflection sheet is disposed on the first face and has a plurality of holes. At least two holes are located in a range of the opening. Each LED is disposed in one hole and the corresponding opening. Each LED comprises a light-emitting portion and a base. The base further comprises at least two electrodes connected to the second face of the PCB.

17 Claims, 5 Drawing Sheets

BOTTOM LIGHTING MODULE

FIELD OF THE INVENTION

The present invention relates to a bottom lighting module, more particularly to an LED light source of the bottom lighting module.

BACKGROUND OF THE INVENTION

Nowadays, the liquid crystal displays (LCD) are generally used in all kind of information displays. The main structure of the LCD can comprise a panel module and a back light module. The panel module roughly comprises an Indium Tin Oxide (ITO) conductive glass substrate, a liquid crystal layer, an alignment film, color filters, polarizing sheets and a driver integrated circuit. The back light module mainly comprises a light source, a light guide plate, a prism sheet, a reflection sheet, a diffusion sheet and various optical sheets. The back light module is to provide the light source to the LCD. Generally, the performance of the LCD reflects the quality of every individual element. For example, the back light module plays an important role in the screen's brightness, intensity, contrast and visual angle.

The back light module can be generally classified into an extremity type and a bottom type, based on the light source. The light source of the extremity type is located at the side face of the back light module and thereby the thickness of the back light module can be reduced. In the market now, most light sources of the LCDs belong to this type of back light module. On the other hand, the light source of the bottom type is located under the back light module and thus better even brightness can be obtained. For the bottom type can provide a larger mounting space, it can contain more light sources and is suitful to be applied to the display requiring higher brightness and wider visual angle.

Due to rapid advance in the electronic manufacture technology, a recent breakthrough in the light effect of the LED can greatly help to improve the display ability of the LCD screens. Technically speaking, it is hoped that, by the year 2005, the light effect of the LED can exceed that of the cold cathode tube. Due to its swift response and feature in emitting visible light such as red, blue and green, the LED has a great opportunity to play a leading role in the light source of the LCD industry.

Referring to FIGS. 1A and 1B, FIG. 1A is an exploded view of a bottom lighting module with a conventional LED, and FIG. 1B is an cross-sectional view of the bottom lighting module of FIG. 1A in an assembled state. The back light module 1 comprises a PCB 10, a plurality of light-emitting diodes (LEDs) 14 and a heat sink 16. The PCB 10 has a first face 101, a second face 102 opposing to the first face 101, and a hole 103 connecting spatially the first face 101 and the second face 102.

The LED 14 disposed in the hole 103 comprises a light-emitting portion 141 and an LED-base 142. The LED-base 142 is inserted into the respective hole 103 to leave the light-emitting portion 141 above the PCB 10. The LED-base 142 comprises at least two electrodes 143 connected to the second face 102 of the PCB 10. For the two electrodes 143 electrically connects with the PCB 10, the PCB 10 can control to the LED 14.

The heat sink 16 comprises a main body 161 and a plurality of fins 162. One side of the main body 161 is set under the second face 102 of the PCB 10, while another face is used to form the fins 162. The heat sink 16 is usually made of a heat conduction material like aluminum or copper. Further, a heat sink medium 17 is accommodated in the sealed space formed between the heat sink 16 and the second face 102 of the PCB 10. The heat medium 17 is used to transport the heat generated by the LED-base 142 to the heat sink 16.

As illustrated in FIG. 1B, the back light module 1 uses a screw 19 to fasten firmly the PCB 10 and the heat sink 16. The PCB 10 has at least one aperture 122 for the screw 19 to penetrate downward through the PCB 10.

As illustrated in FIG. 2, a top view of FIG. 1B with the heat sink 16 locking firmly to the PCB 10 by the screw 19 is shown. The first face 101 of the PCB 10 has a plurality of holes 103 for inserting the respective LEDs 14.

As described above in FIG. 2, the PCB 10 needs to form a plurality of holes 103 in advance so that a corresponding number of the LEDs 14 can be inserted into the holes 103 one by one. In this process, using a mill machine to fabricate the holes 103 is usually expensive. Therefore, how to lessen above cost problem is deserved to discuss.

In addition, the connection way by screwing causes another drawback that affects light efficiency of the back light module. In the back light module 1, the first face 101 of the PCB 10 is usually adhered by a reflection sheet 18 and located under a diffusion sheet 15 that spaces from the reflection sheet 18 by a predetermined spacing. The light of the LED 14 would have a mixing effect in the sealed space formed between the reflection sheet 18 and the diffusion sheet 15

Hence, when the screw 19 integrates firmly the PCB 10 and the reflection sheet 18, the LED 14 emits the light to the diffusion sheet 15 and the LED light will reflect between the reflection sheet 18 and the diffusion sheet 15. However, the slit area around the screw 19 makes the reflection sheet 18 area piece-wise and would make the reflective LED light uneven. Definitely, the brightness and color of the light of the back light module 1 in accordance with the present invention would be greatly affected.

SUMMARY OF THE INVENTION

The object of the present invention is to provide a back lighting module, which has the LED as the light source of the bottom light module.

In accordance with the present invention, a bottom lighting module can comprise a PCB, a reflection sheet and a plurality of light-emitting diodes (LEDs). The PCB has a first face, a second face opposing to the first face, and an opening connecting spatially the first face and the second face. The reflection sheet is disposed on the first face and has a plurality of holes. At least two of the holes are located in a predetermined range of the opening. Each LED disposed in one hole and the corresponding opening comprises a light-emitting portion and an LED-base. The LED-base comprises at least two electrodes connected with the second face of the PCB.

In a preferred embodiment, the bottom lighting module further comprises a heat sink disposed at the side of the second face and contacted with the LED-base. Also, the module further comprises a first combiner (a nut for example) and a second combiner (a screw for example), that the first combiner (nut) is secured on the second face. By engaging the first combiner (nut) and the second combiner (screw), the heat sink in between can be firmly sandwiched. The LED-base has an around section which is set on the second face for holding the PCB. In addition, a heat-dissipation paste is used to hold together the heat sink and the LED-base.

In a preferred embodiment, the PCB includes at least two PCBs, in which a space between these two PCBs are formed as the opening. In another embodiment, the PCB includes a single PCB and the opening is formed in the PCB. The opening has a first trough-wall and a second trough-wall for holding a plurality of LEDs. The PCB can be an island shape, a fin shape or an I-shape.

BRIEF DESCRIPTION OF THE DRAWING

Other features and advantages of this invention will become more apparent in the following detailed description of the preferred embodiments of this invention, with reference to the accompanying drawings, in which.

DETAILED DESCCRIPTIONS OF THE PREFERRED EMBODIMENTS

Figure 1:
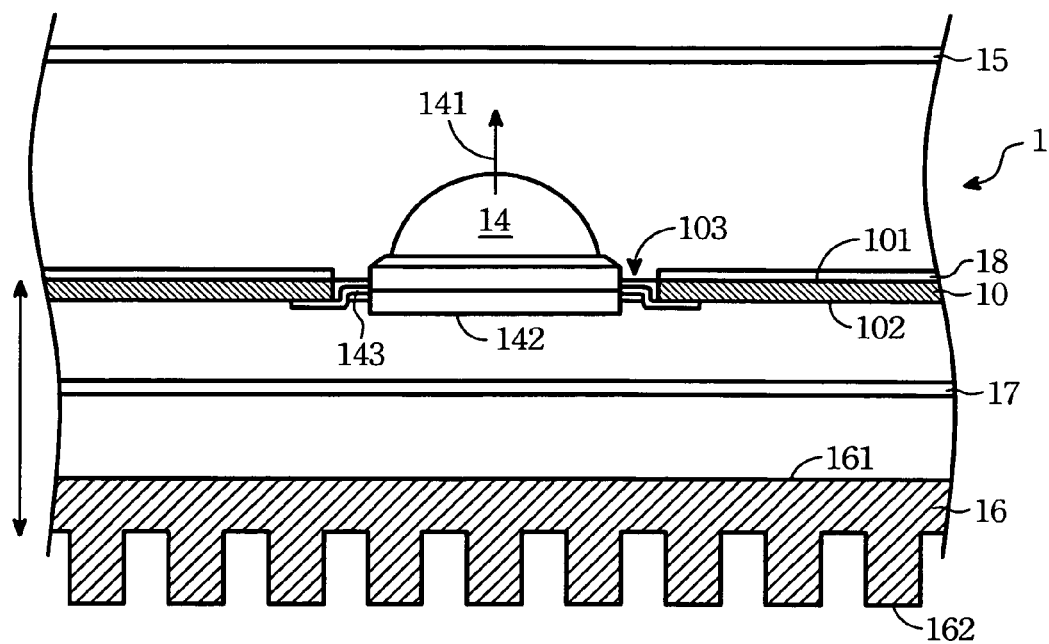
FIG. 1A is an exploded view of a conventional bottom lighting module having LEDs as the light source.
FIG. 1B is a lateral view of the FIG. 1A in an assembled state.
Figure 1:
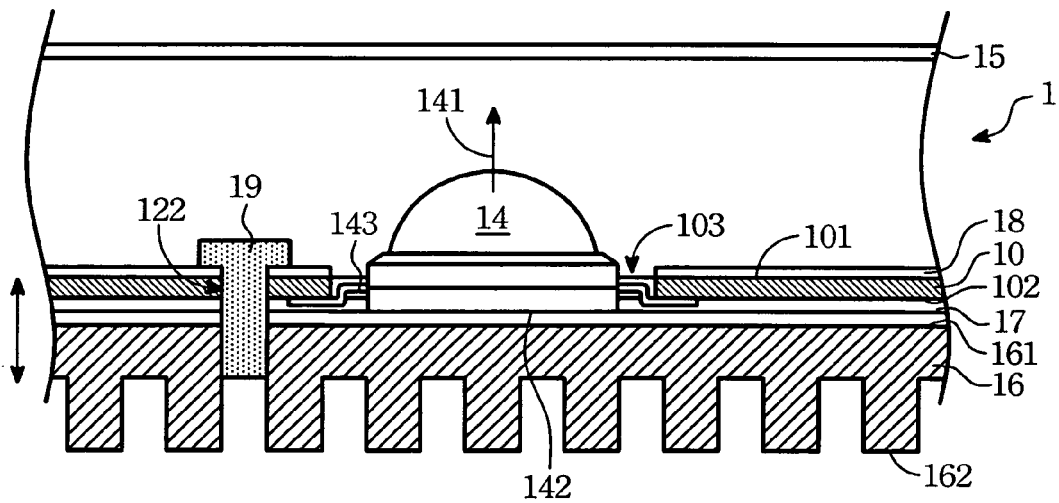
Figure 2:
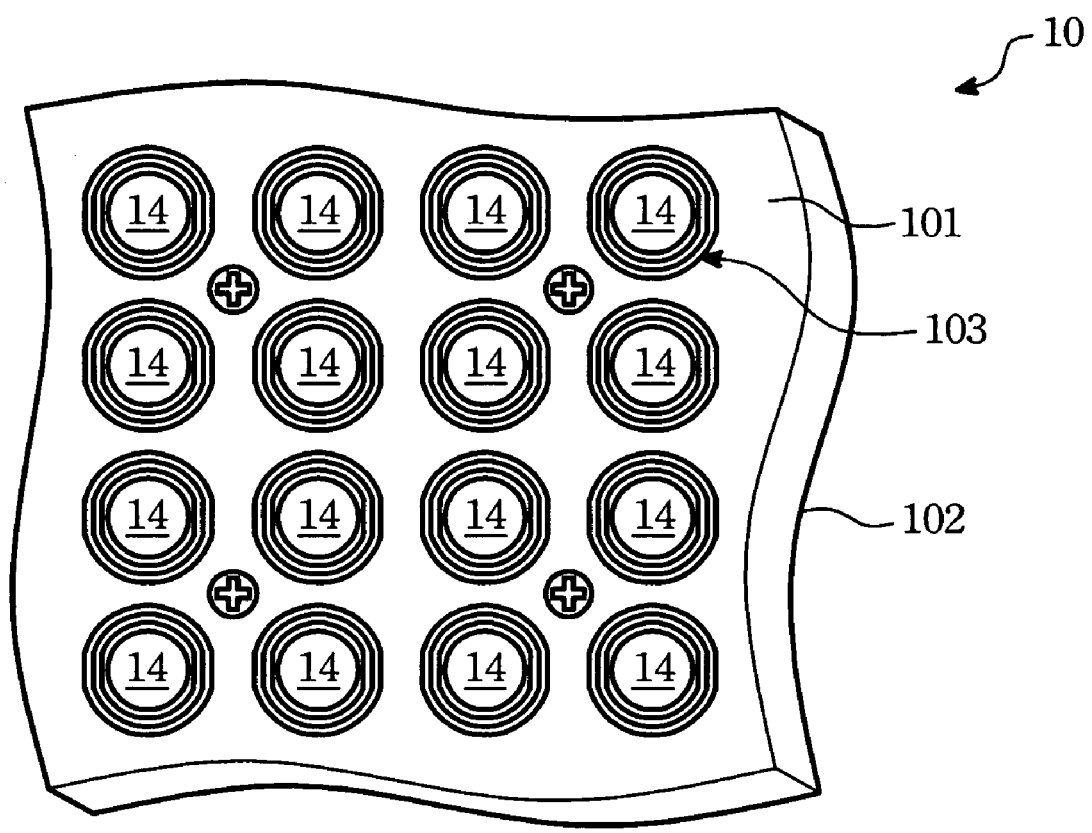
FIG. 2 is a top view of the LEDs in the conventional bottom lighting module resembling that in FIG. 1A or 1B.
Figure 3:
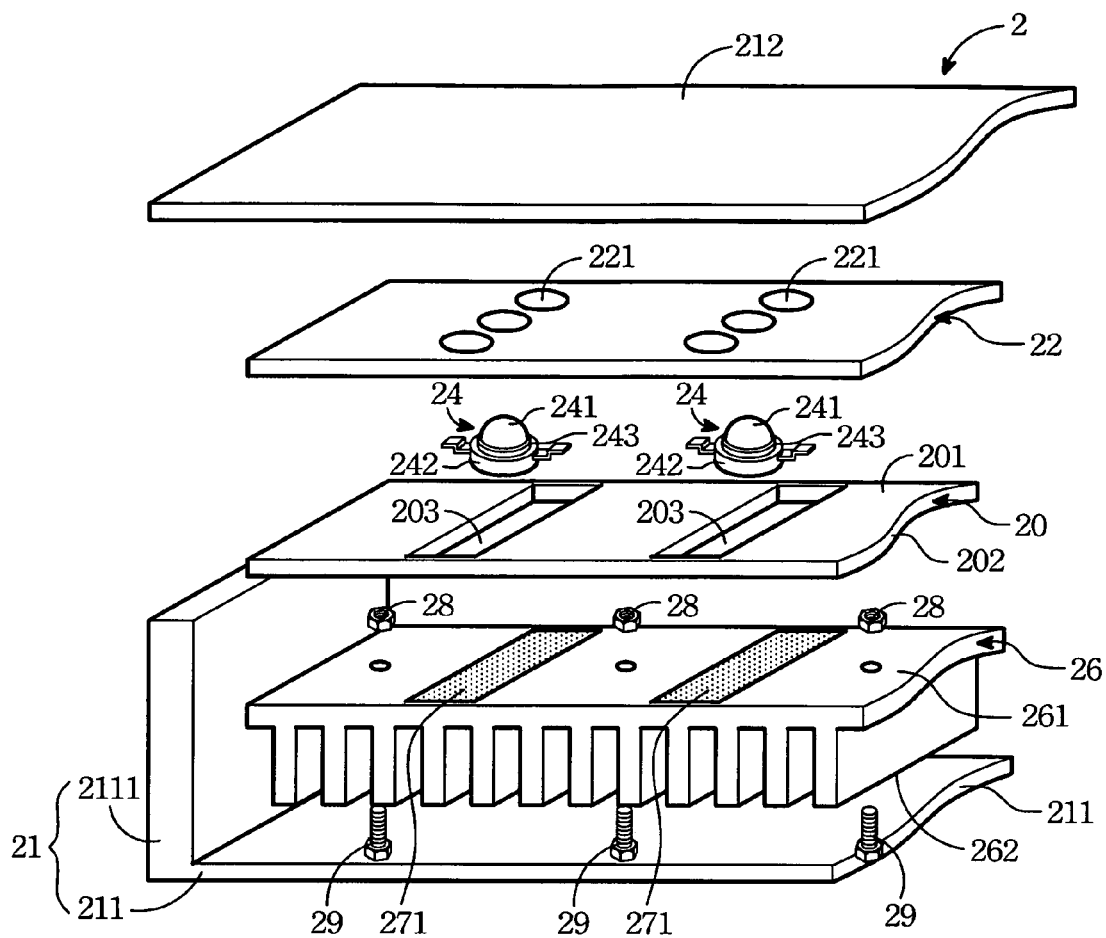
FIG. 3 is an exploded view of a preferred bottom lighting module according to the present invention.

Referring to FIG. 3, an exploded view of a preferred bottom lighting module according to the present invention is shown. The bottom lighting module 2 comprises a PCB 20, a reflection sheet 22 and a plurality of LEDs 24. The PCB 20 has a first face 201, a second face 202 opposing to the first face 201, and at least a opening 203 connecting spatially the first face 201 and the second face 202.

The LEDs 24 can be connected on the PCB 20. The reflection sheet 22 adhered to the first face 201 of the PCB 20 has a plurality of holes 221 to expose respective LEDs 24. As shown, each opening 203 is accounted for at least two holes 221 of the reflection sheet 22 (three holes 221 for each opening 22 in FIG. 3).

Each LED 24 disposed in one respective hole 221 and the corresponding opening 203 comprises a light-emitting portion 241 and an LED-base 242. The light-emitting portion 241 is located on the first face 201 of the PCB 20. Due to the LED-base 242 is the major heat source, so the LED-base 242 is purposely located under the second face 202 of the PCB 22. Upon such an arrangement, the heat generated at the LED-base 242 will not influence the light efficiency over the first face 201 of the PCB 20. Except for helping the light from the LED 24 to mix evenly before emitted out of the bottom lighting module 2, the reflection sheet 22 can also provide auxiliary support to locate and hold the LEDs 24 in the opening 203.

Figure 4:
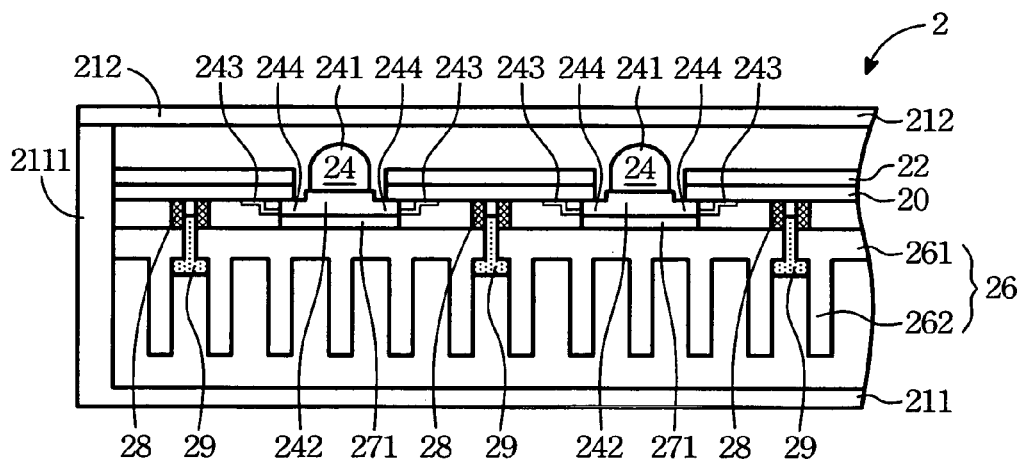
FIG. 4 is a fragmentary sectional view of FIG. 3 in an assembled state according to the present invention.

Referring to FIG. 4, a fragmentary sectional view of FIG. 3 in an assembled state according to the present invention is shown. The LED-base 242 comprises at least two electrodes 243 connected with the second face 202 of the PCB 20. Each electrode 243 bridges electrically the LED 24 and the PCB 20. Also, a bonus of the electrodes 243 is to solidly connect the LED 24 and the PCB 20. In this embodiment, the LED-base 242 has an around section 244 to touch the second face 202 and thus to hold or support the PCB 20.

The bottom lighting module 2 further comprises a heat sink 26. The heat sink 26 comprises a main body 261 and a plurality of heat sink fins 262. The upper side 261 (i.e. the main body 261) of the heat sink 26 is set under the second face 202 of the PCB 20, while the lower side of the heat sink 26 is formed as the heat sink fins 262. The heat sink 26 can be made of a material with a high heat-conduction property such as the aluminum or the copper. In addition, a layer of heat-dissipation medium 271 such as a heat-dissipation paste or a soft heat-conduction gluing material can be applied between the heat sink 26 and the second face 202 of the PCB 20 for enhancing the heat transportation from the LED-base 242 to the heat sink 26. Preferably, the heat medium 271 can be disposed under the second face 202 and contact the LED-base 242 of LED 24.

The bottom lighting module 2 comprises a first combiner, a nut 28 for example, and a second combiner to engage with the first combiner, a screw 29 for example. The first combiner (nut 28) disposed at the second face 202 is used to a heat sink 26 disposed under the second face 202 so as to contact the LED-base and sandwiched between the first combiner (screw 29) and the second combiner. The first combiner (nut 28) can be tight disposed in advance at the second face 202 of the PCB 20 by embedding or welding. As shown, the heat sink 26 can have vertical drilled holes for the respective second combiners (screws 29) to pass and to further engage with the corresponding holes of the first combiners (nuts 28).

Moreover, the bottom lighting module 2 further comprises a back bezel 21. The back bezel 21 comprises a base 211 and a sidewall 2111. The base 211 is set under the heat sink 26 and the sidewall 2111 is to support and thus accommodate inside the reflection sheet 22, the PCB 20 and the heat medium 271. The base 211 and the sidewall 2111 can be integrated as a one piece or separated to different pieces. The base 211 and the heat sink 26 can be held firmly by screws. The heat sink 26 can be a heat fin, a heat pipe assembly, or a fan device.

By utilizing the difference between the reflectivity of the diffusing plate 212 and that of the air, part of the light hitting the diffusing plate 212 can be reflected reciprocally between the diffusing plate 212 and the reflection sheet 22 so as to thoroughly mix the light emitted by the LEDs 24. Upon such an arrangement, the light leaving the diffusing plate 212 can have homogeneous brightness and color-ness.

Figure 5:
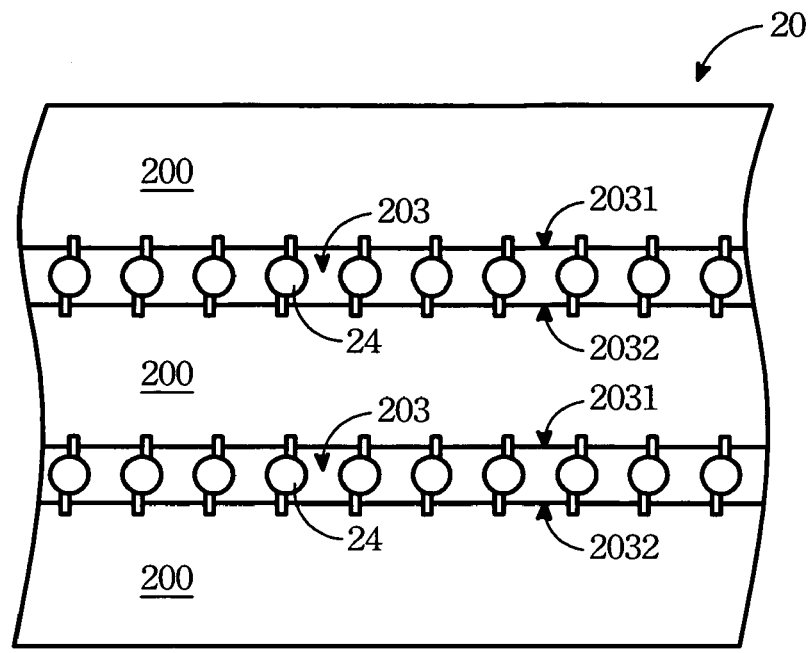
FIG. 5A is a top view of the LEDs as well as the PCB in another preferred embodiment according to the present invention, in which the PCB is formed as an island shape.
FIG. 5B is a top view of the LEDs as well as the PCB in a further embodiment according to the present invention, in which the PCB is formed as a fin shape.
FIG. 5C is a top view of the LEDs as well as the PCB in one more embodiment according to the present invention, in which the PCB is formed as an I-shape.
Figure 5:
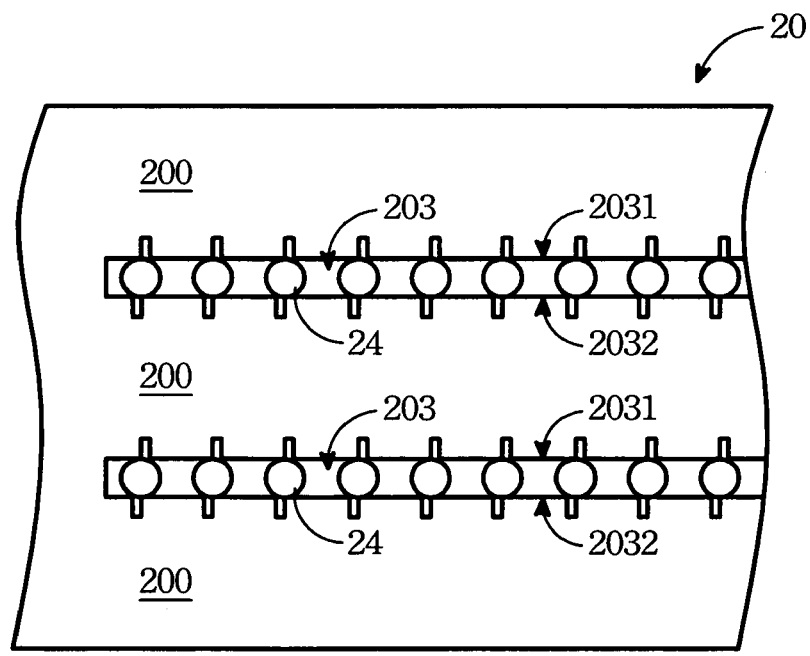
Figure 5:
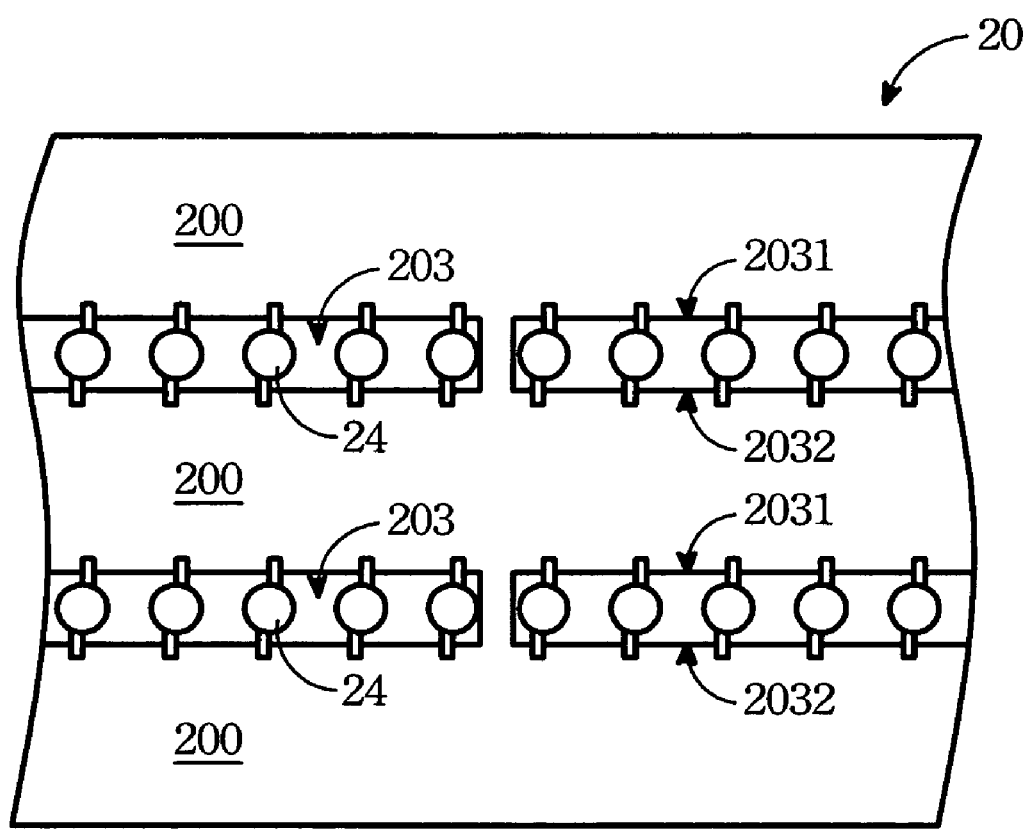

In another embodiment of the present invention, the PCB 20 can be consisted of at least two PCBs 200, arranged side by side, as shown in FIG. 5A (three PCBs 200 in the figure) and the space formed between any two adjacent PCBs 200 can be arranged as the opening 203. The opening 203 then has a first trough-wall 2031 accounting for one PCB 200 and a second trough-wall 2032 accounting for another PCB 200 to hold a plurality of LEDs 24 therein. In the present invention, the PCB 200 can be an island shape (as shown in FIG. 5A), a fin shape (as shown in FIG. 5B), an I-shape (as shown in FIG. 5C) or any other relevant shape. The opening 203 can be a simple hole as that shown in FIG. 3, a open slot formed by two adjacent PCBs 200 as shown in FIG. 5A, a one-end-open slot as shown in FIG. 5B or 5C.

The merits from adopting the second combiner (screw) and the opening according to the present invention are as follows.

1. Easy manufacturing of the openings of the PCB.

2. By providing the holes of the reflection sheet, locating of the LEDs can be much convenient.

3. By locating the second combiner (screw) to the second face of the PCB, lighting above the first face will not be affected.

To sum up, the bottom lighting module of the present invention provides a simple design of opening to improve the drawbacks of making holes in the convention technology.

I claim:

1. A bottom lighting module, comprising:
    a printed circuit board (PCB) having a first face, a second face opposing to the first face, and at least one opening through the first face and the second face;
    a reflection sheet disposed on the first face and having a plurality of holes, wherein the opening corresponds to of the plurality of holes; and
    a plurality of light emitting diodes(LEDs) disposed individually in the respective holes and the opening, wherein the opening has a first trough-wall and a second trough-wall for holding the plurality of LEDs, and each LED has a light-emitting portion and an LED-base having at least two electrodes connected to the second face of the PCB.

2. The bottom lighting module according to claim 1, further comprising a heat sink disposed under the second face so as to contact the LED-base.

3. The bottom lighting module according to claim 2, further comprising a first combiner and a second combiner, the first combiner being secured on the second face, the heat sink being sandwiched between the first combiner and the second combiner.

4. The bottom lighting module according to claim 3, wherein the first combiner is secured on the PCB by embedding or welding.

5. The bottom lighting module according to claim 2, wherein the LED-base has a periphery portion contacting the second face and supporting the PCB.

6. The bottom lighting module according to claim 2, wherein a heat-dissipation paste is applied between the heat sink and the LED-base.

7. The bottom lighting module according to claim 1, opening wherein the PCB comprises at least two sub-PCBs separated from each other by the at least one opening.

8. The bottom lighting module according to claim 1, wherein the PCB is a single PCB and the at least one opening is formed in the PCB.

9. The bottom lighting module according to claim 1, wherein the PCB has an island shape, a fin shape or an I-shape.

10. A bottom lighting module, comprising:
    a PCB having a first face, a second face opposing to the first face, and at least one opening through the first face and the second face;
    a plurality of LEDs disposed in the corresponding opening, wherein the opening has a first trough-wall and a second trough-wall for holding the plurality of LEDs, and each LED has a light-emitting portion and an LED-base having at least two electrodes connected to the second face of the PCB;
    a first combiner being secured on the second face of the PCB; a second combiner; and
    a heat sink disposed under the second face so as to contact the LED-base and sandwiched between the first combiner and the second combiner.

11. The bottom lighting module according to claim 10, further comprising a reflection sheet being disposed on the first face and having a plurality of holes, wherein the at least one opening corresponds to at least two of the plurality of holes.

12. The bottom lighting module according to claim 10, wherein the LED-base has a periphery portion contacting the second face and supporting the PCB.

13. The bottom lighting module according to claim 10, wherein a heat-dissipation paste is applied between the heat sink and the LED-base.

14. The bottom lighting module according to claim 10, wherein the PCB comprises at least two sub-PCBs separated from each other by the at least one opening.

15. The bottom lighting module according to claim 10, wherein the PCB is a single PCB and the at least one opening is formed in the PCB.

16. The bottom lighting module according to claim 10, wherein the first combiner is secured on the PCB by embedding or welding.

17. The bottom lighting module according to claim 10, wherein the PCB has an island shape, a fin shape or an I-shape.

* * * * *